(12) United States Patent
Allers

(10) Patent No.: US 6,228,771 B1
(45) Date of Patent: May 8, 2001

(54) CHEMICAL MECHANICAL POLISHING PROCESS FOR LOW DISHING OF METAL LINES IN SEMICONDUCTOR WAFER FABRICATION

(75) Inventor: Karl-Heinz Allers, München (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/533,527

(22) Filed: Mar. 23, 2000

(51) Int. Cl.$^7$ .................................................. H01L 21/00
(52) U.S. Cl. .............................. 438/692; 216/38; 216/88; 216/89; 438/693; 438/750; 438/754
(58) Field of Search .................................. 438/691, 692, 438/693, 745, 754, 750, 751; 216/38, 88, 89

(56) References Cited

U.S. PATENT DOCUMENTS

| | | | |
|---|---|---|---|
| 5,502,008 | * | 3/1996 | Hayakawa et al. ............. 438/692 X |
| 6,001,730 | * | 12/1999 | Farkas et al. .................... 438/693 X |
| 6,083,840 | * | 7/2000 | Mravic et al. ................... 438/754 X |
| 6,114,246 | * | 9/2000 | Weling ............................. 438/754 X |
| 6,117,775 | * | 9/2000 | Kondo et al. .................... 438/754 X |

* cited by examiner

Primary Examiner—William Powell
(74) Attorney, Agent, or Firm—Stanton Braden

(57) ABSTRACT

A two-step chemical mechanical polishing (CMP) process is provided for low dishing of metal lines in trenches in an insulation (oxide) layer, e.g., of silicon dioxide of a thickness of about 100–2000 nm, of a semiconductor wafer, e.g., of silicon, during its fabrication. The first step involves chemically mechanically polishing a metal layer, e.g., of copper of a thickness of about 200–2000 nm, disposed on the oxide layer and having a lower portion located in the trenches for forming metal lines and an upper portion overlying the lower portion. The first step polishing is effected at a high downforce, e.g., 3–8 psi, to remove at a high rate the upper portion of the metal layer substantially without removing the lower portion thereof and substantially without dishing of the lower portion located in the trenches. The second step involves continuing the CMP at a lower downforce, e.g., 1–5 psi, to remove at a lower rate the lower portion of the metal layer with attendant minimized dishing to an extent for providing the metal lines as individual metal lines correspondingly disposed in the trenches. The total polishing time is about 120–48 seconds (2–8 minutes).

22 Claims, 3 Drawing Sheets

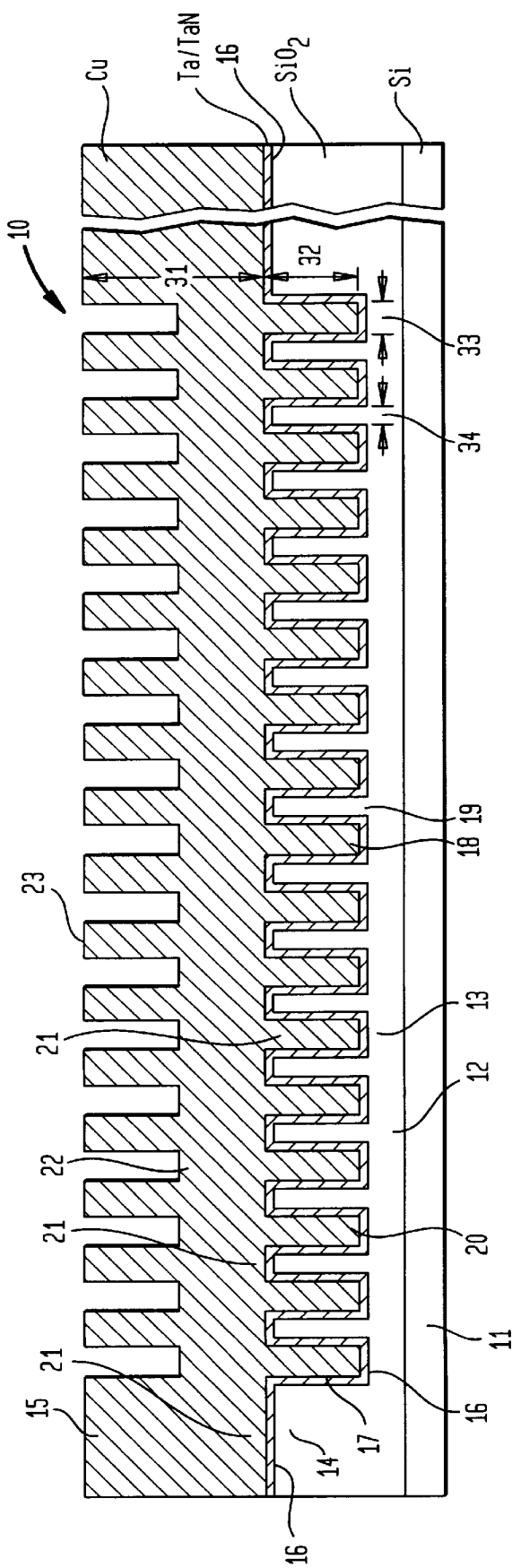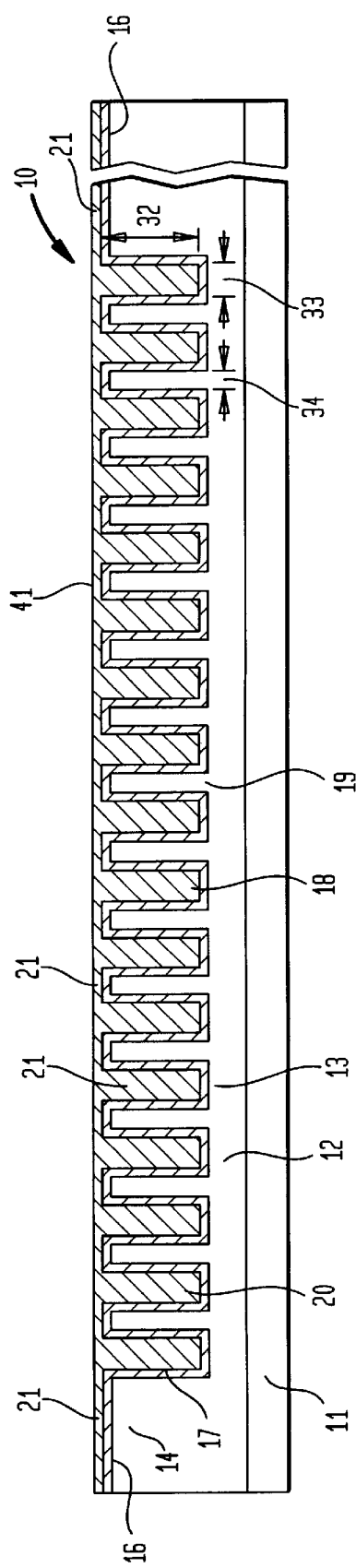

CHEMICAL MECHANICAL POLISHING PROCESS FOR LOW DISHING OF METAL LINES IN SEMICONDUCTOR WAFER FABRICATION

FIELD OF INVENTION

This invention relates to a chemical mechanical polishing (CMP) process for low dishing of metal lines embedded in a dielectic layer during semiconductor wafer fabrication, and more particularly, to a CMP process having two successive polishing steps for providing metal lines as individual lines in trenches on an insulation layer, substantially without pronounced attendant dishing. As used herein, "semiconductor wafer" means any microelectronic device, substrate, chip or the like, e.g., of silicon, used to provide an integrated circuit or other related circuitry structure, and in particular capable of forming an arrangement of metal lines on an insulation layer thereof.

BACKGROUND OF THE INVENTION

In fabricating microelectronic semiconductor devices and the like on a semiconductor wafer (substrate or chip), e.g., of silicon, to form an integrated circuit (IC), etc., various metal layers and insulation layers are provided in selective sequence on the wafer. To maximize device component integration in the available wafer area to fit more components in the same area, increased IC miniaturization is utilized. Reduced pitch dimensions are used for denser packing of components per very large scale integration (VLSI) technique, e.g., at sub-micron dimensions, i.e., below 1 micron or 1,000 nanometers (nm) or 10,000 angstroms (A).

A CMP process is known for providing a damascene (inlaid) pattern, i.e., an arrangement of closely spaced apart individual metal lines, e.g., of copper (Cu), unconnected to each other and disposed in a like arrangement of closely spaced apart trenches, in an insulation layer, e.g., an oxide layer such as of silicon dioxide ($SiO_2$), in the IC fabrication of a semiconductor wafer, e.g., of silicon (Si).

A liner layer forming an adhesion promoting diffusion barrier is optionally disposed between a lower insulation layer such as an oxide layer containing the trenches and an upper metal layer used to provide the individual metal lines in the trenches. When the liner layer is absent, the known CMP process is a one-phase process comprising a one-step metal layer CMP process, and when the liner layer is present, the known CMP process is a two-phase process comprising a one-step metal layer CMP process as a first phase, e.g., of about 210 seconds (3.5 minutes) polishing time, and a liner layer removing CMP process as second phase, e.g., of about 90 seconds (1.5 minutes) polishing time, for a total process (polishing) time of about 300 seconds (5 minutes).

For instance, the wafer, e.g., a circular disc of about 8 inches (200 mm) diameter, has a copper layer disposed on the oxide layer so as to provide an arrangement of wide metal lines, i.e., metal lines having a width of at least about 2 microns, such as about 2–100 microns, in the arrangement of trenches of the oxide layer. The wafer is polished in conventional manner by a rotating polishing pad, e.g., at about 20–100 rpm, such as about 55 rpm. The first phase CMP is effected under a polishing pressure downforce of about 4.5 psi for a total first phase CMP process (polishing) time of about 210 seconds (3.5 minutes), to an extent for providing the wide metal lines as individual lines unconnected to each other, i.e., by the metal (copper) of the copper metal layer.

Specifically, sufficient overpolishing is used to assure complete removal of the metal layer portion which overlies the metal lines and also the metal layer portion which is disposed over the adjacent field areas of the oxide layer outwardly of the metal lines. This overpolishing assures that the individual metal lines are no longer connected to each other through the overlying metal layer portion.

However, the so polished wafer suffers from pronounced attendant dishing in the damascene pattern area containing the metal line arrangement in the trench arrangement. Dishing is the formation of a concave depression, e.g., in the arrangement of metal lines in the arrangement of trenches, which occurs during CMP with the rotating polishing pad, and becomes increasingly pronounced as polishing pressure downforce increases, which at the same time increases the process speed (polishing rate).

On the one hand, copper CMP is one of the most costly processes in semiconductor fabrication. Any polishing rate increase (polishing time reduction) would thus be desirable to improve the competitiveness of this CMP process. On the other hand, dishing, which generally increases with increasing polishing pressure, is an important process parameter that directly controls the sheet resistance (RS) performance of each individual wide metal line. In this regard, RS is the quotient of the resistivity of the metal material divided by the metal line thickness (height) and is a measure of the amount of current the line can carry. Of course, such metal line height decreases as the dishing depth increases, and the smaller the metal line cross sectional area, the smaller the current the line can carry.

It is desirable to have a CMP process for forming an arrangement of closely spaced apart metal lines, especially wide metal lines, e.g., of copper, as individual metal lines in a like arrangement of trenches in an insulation layer of a semiconductor wafer, which provides an increase in polishing rate (shorter polishing time) without an increase in dishing or a reduction in dishing while retaining a high polishing rate.

SUMMARY OF THE INVENTION

The foregoing drawbacks are obviated in accordance with the present invention by providing a two-step chemical mechanical polishing (CMP) process for low dishing of metal lines in semiconductor wafer fabrication, to form an arrangement (damascene pattern) of closely spaced apart metal lines, especially wide metal lines, e.g., of copper, as individual metal lines in a like arrangement of trenches in an insulation layer on the wafer, substantially without pronounced attendant dishing.

According to the invention, the successive two-step CMP process for low dishing of closely spaced apart metal lines formed in closely spaced apart trenches in an insulation layer of a semiconductor wafer during fabrication thereof, comprises:

a first step of chemically mechanically polishing a metal layer disposed on the insulation layer and having a lower portion located in the trenches of the insulation layer for forming metal lines and an upper portion overlying the lower portion;

the first step polishing being effected at a selectively high downforce sufficient to remove at a corresponding high (fast) rate (comparatively short polishing time) the upper portion of the metal layer substantially without removing the lower portion thereof and substantially without dishing of the lower portion located in the trenches; and a second step of continuing the polishing at a selectively lower downforce sufficient to remove at a corresponding lower (slower) rate the lower portion of the metal layer with attendant minimized or reduced dishing to an extent for providing the metal lines as individual metal lines correspondingly disposed in the trenches.

Desirably, the first step is effected at a high downforce of about 3–8 psi, and the second step is effected at a lower downforce of about 1–5 psi, and the total polishing time is about 120–480 seconds (2–8 minutes).

Typically, the wafer comprises silicon, the insulation layer comprises silicon dioxide and the metal layer comprises copper. The insulation layer may have a thickness of about 100–2000 nm (0.1–2 micron), and the metal layer may have a thickness of about 200–2000 nm (0.2–2 microns).

The polishing may be effected using a chemical mechanical polish comprising an alumina abrasive and ferric nitride as oxidizer.

In particular, a liner layer forming an adhesion promoting diffusion barrier may be disposed between the insulation layer and the metal layer. The liner layer can comprise tantalum/tantalum nitride (Ta/TaN), and can have a thickness of about 5–200 nm (0.005–0.2 micron).

The invention will be more readily understood from the following detailed description taken with the accompanying drawings and claims.

BRIEF DESCRIPTION OF THE DRAWINGS

FIG. 1 is a side sectional view of a conventional semiconductor wafer having an insulation layer with an arrangement of trenches on which a metal layer is disposed for forming an arrangement of metal lines in the trenches;

FIG. 2 is a side sectional view of the wafer shown in FIG. 1, after completing the first CMP step according to the invention;

Figure 3:
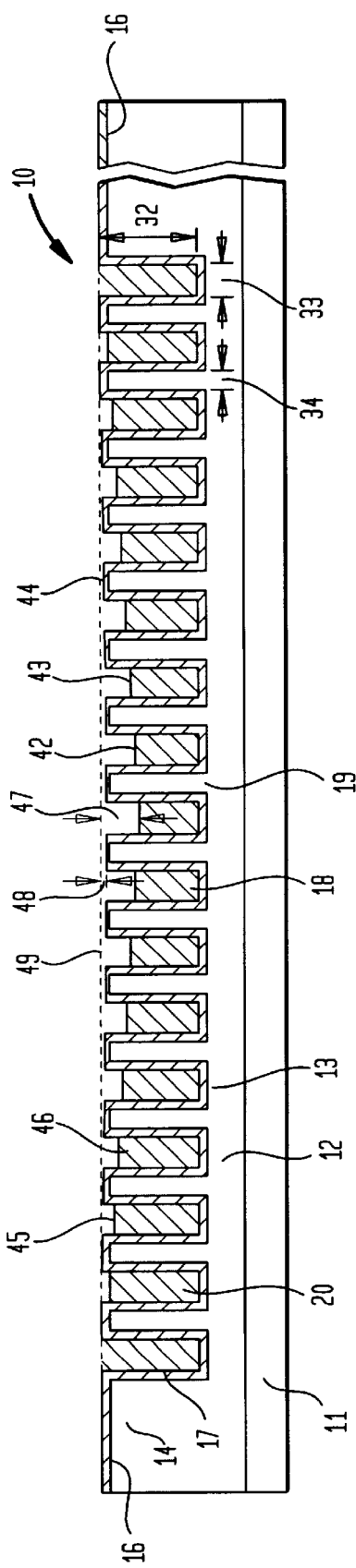
FIG. 3 is a side sectional view of the wafer shown in FIG. 2, after completing the second CMP step according to the invention, and illustrating the resultant low dishing of the metal lines.

It is noted that the drawings are not to scale, some portions being shown exaggerated to make the drawings easier to understand.

DETAILED DESCRIPTION

Referring now to FIG. 1, there is shown a side sectional view of a conventional semiconductor wafer 10. Wafer 10 has a base 11, an insulation layer 12, a damascene pattern area 13, a field area 14, a metal layer 15, a liner layer 16, a trench area 17, a trench arrangement 18, side walls 19, a metal line arrangement 20, a metal layer lower portion 21, a metal layer upper portion 22, a crenelated area 23, a metal layer thickness 31, a metal line height 32, a metal line width 33, and an interspace width 34.

Wafer 10 is typically of circular disc shape with a diameter of about 8 inches (200 mm) and formed of silicon. It includes a base 11, e.g., of silicon, covered by an insulation layer 12, e.g., an oxide layer such as of silicon dioxide, as interlayer dielectric, e.g., having a thickness of about 100–2000 nm, such as about 810 nm, which is provided with a medially located damascene pattern area 13 and a field area 14 outwardly of damascene pattern area 13. Metal layer 15, e.g., having a thickness of about 200–2000 nm, such as about 1000 nm, or more typically, as here, about 700 nm (0.7 micron), e.g., of constant thickness plated copper, is disposed on oxide layer 12 and overlies damascene pattern area 13 and field area 14.

Liner layer 16, e.g., of tantalum/tantalum nitride (Ta/TaN), e.g., having a thickness of about 5–200 nm, such as about 50 nm, is optionally, yet desirably, interposed between oxide layer 12 and metal layer 15 as a conventional temporary adhesion promoting diffusion barrier.

Trench area 17 is defined in oxide layer 12 to form an arrangement of closely spaced apart trenches 18 bounded between upright side walls 19 of oxide layer 12 in damascene area 13. Trenches 18 are filled with metal from metal layer 15 to form a corresponding arrangement of closely spaced apart metal lines 20 contiguous with the overlying lower metal portion 21 of metal layer 15 located below the upper metal portion 22 of metal layer 15. When liner layer 16 is present, it extends along and through trenches 18 as an intermediate layer between oxide layer 12 and the lower metal portion 21 of metal layer 15 located in trenches 18. In effect, damascene pattern area 13 encompasses trench area 17, trenches 18, side walls 19, metal lines 20 and lower metal portion 21, prior to CMP processing.

In a typical case, the thickness (height) 31 of metal layer 15 is about 700 nm (0.7 micron), the depth (height) 32 of trenches 18 and metal lines 20 is about 400 nm (0.4 micron), the width 33 of trenches 18 and metal lines 20 is about 15 microns (thus being a wide metal line width of 2–100 microns, as aforesaid), and the width 34 of side walls 19 or interspaces between adjacent metal lines 20 is about 3 microns.

It is noted that metal layer height 31 and metal line height 32 are shown in FIG. 1 as having much larger dimensions than metal line width 33 and interspace width 34 for purposes of clarity. This is why the upper or overburden portion of metal layer 15, which actually has a constant thickness throughout, appears to be formed as a crenelated area 23 overlying damascene pattern area 13. In fact, metal layer height 31 and metal line height 32 are very small compared to metal line width 33 and interspace width 34, and no such pronounced crenelated area 23 is really present. Also, metal line width 33 is about 5 times larger than interspace width 34.

Since FIG. 1 shows seventeen (17) metal lines 20 and sixteen (16) intervening side walls 19, the overall width of trench area 17 and overlying lower metal layer portion 21 encompassed by damascene pattern area 13 is about 300 microns, i.e., 303 microns (303,000 nm), compared to only 0.7 micron (700 nm) for metal layer height 31.

FIG. 1 represents a conventional wafer prior to subjecting it to the two-step CMP process according to the invention.

Referring now to FIG. 2, there is shown a side sectional view of the wafer shown in FIG. 1, after completing the first CMP step according to the invention. In FIG. 2, items 10 to 14, 16 to 21 and 32 to 34 are the same as those in FIG. 1. FIG. 2 also includes a first step polished surface 41.

FIG. 2 shows that the bulk of the copper metal layer 15 has been removed by the first CMP step, leaving only the overlying lower portion 21 now exposed at first step polished surface 41, which is generally free from any significant dishing. In the absence of liner layer 16, the height of overlying lower portion 21 would correspond more or less to the height of the top surface of the adjacent field area 14 of oxide layer 12. Indeed, copper in overlying lower portion 21 of copper metal layer 15 may even cover the adjacent field area 14.

The first, bulk polishing, step CMP is effected by a rotating polishing pad, e.g., at about 20–100 rpm, such as 55 rpm, using an alumina abrasive and ferric nitride as oxidizer at a high polishing pressure downforce of about 3–8 psi, such as about 6 psi, for a comparatively fast polishing time, such as about 95 seconds, so as to remove the bulk of the metal of metal layer 15 without significant attendant dishing.

Referring now to FIG. 3, there is shown a side sectional view of the wafer shown in FIG. 2, after completing the second successive CMP step according to the invention. In FIG. 3, items 10 to 14, 16 to 20 and 32 to 34 are the same as those in FIG. 1. FIG. 3 also includes a second step polished surface 42, a dished surface 43, an erosion surface 44, a metal line surface 45, an individual metal line 46, a dishing depth 47, an erosion depth 48 and a reference plane 49.

FIG. 3 shows that the remainder of the copper metal layer 15 represented by overlying lower portion 21 has been removed by the second CMP step, which is an overpolishing step designed to expose second step polished surface 42. Second step polished surface 42 defines an only slightly dished composite metal line surface 43 and attendant oxide interspace erosion surface 44, resulting in individual metal line surfaces 45 of individual metal lines 46 unconnected to each other, i.e., unconnected through the copper metal of lower metal portion 21 of copper metal layer 15, inasmuch as such remainder of the metal of lower portion 21 above and outside of trenches 18 has now been completely removed by the second CMP step. The dishing depth 47 and oxide erosion depth 48 relative to a horizontal reference plane 49 show that only slight dishing has occurred during the second step CMP.

The second, overpolishing, step CMP is effected by continuing the use of the rotating polishing pad, e.g., at about 20–100 rpm, such as again about 55 rpm, with the alumina abrasive and ferric nitride oxidizer at a lower polishing pressure downforce of about 1–5 psi, such as about 3 psi, for a selective polishing time, such as about 115 seconds, so as to overpolish the remainder of metal layer 15 for its removal without pronounced attendant dishing.

It is seen that the total polishing time of 95+115=210 seconds (3.5 minutes) of the two-step first phase of the CMP process according to the invention is the same as the 210 second (3.5 minute) polishing time of the one-step first phase of the prior art CMP process, as discussed above, whereas the pronounced dishing attendant the one-step prior art process is avoided according to the invention by effecting the second step at a lower polishing pressure downforce, e.g., about 3 psi, instead of at a constant 4.5 psi polishing pressure downforce throughout as in the prior art. In general, according to the invention, the polishing pressure downforce of the second step is at least about 20% less than the polishing pressure downforce of the first step.

According to the first, bulk polishing, step of the invention (FIG. 2), the CMP is effected at a comparatively high polishing pressure downforce such that the bulk removal of metal layer 15 is rapidly achieved, yet removal of metal layer 15 stops at overlying lower metal portion 21 on reaching liner layer 16 or just above it on field area 14. This results in minimal creation of topography or unevenness on the wafer surface being polished, and particularly avoids the creation of significant dishing.

According to the second, overpolishing, step of the invention (FIG. 3), the CMP is effected at a comparatively lower polishing pressure downforce such that removal of the remainder of metal layer 15, i.e., overlying lower metal layer portion 21, is more slowly achieved, again with such removal stopping on reaching liner layer 16 or just above it on field area 14. This results in the creation of only a slight dishing effect on the damascene pattern area 13 of the wafer surface being polished. Similarly, only slight oxide erosion occurs under the given CMP conditions.

Generally, the total polishing time of the two-step first phase CMP process of the invention is about 120–480 seconds (2–8 minutes), of which, for example, about 50–66.7% (50–67%) may be used for the first step and 50–33.3% (50–33%) may be used for the second step.

Thus, with regard to one particular embodiment of the invention, at a short (fast) 120 second (2 minute) polishing time, about 60–80 seconds (1–1.33 minutes) may be used for the first step and about 60–40 seconds (1–0.67 minute) may be used for the second step. Conversely, at a long (slow) 480 second (8 minute) process time, about 240–320 seconds (4–5.33 minutes) may be used for the first step and about 240–160 seconds (4–2.67 minutes) may be used for the second step. At an intermediate 300 second (5 minute) process time, about 150–200 seconds (2.5–3.33 minutes) may be used for the first step and about 150–100 seconds (2.5–1.67 minutes) may be used for the second step.

After the second CMP process step, wafer 10 may be subjected to further processing in conventional manner.

For example, wafer 10 may undergo a second phase CMP process as a touch-up polishing step to remove the exposed portions of liner layer 16, i.e., outwardly of trenches 18, such as by a rotating polishing pad, e.g., at about 15–80 rpm, such as about 40 rpm, using silica abrasive and hydrogen peroxide ($H_2O_2$) as oxidizer, at a polishing pressure downforce of about 3–8 psi, such as about 6 psi, for a polishing time of about 30–180 seconds (0.5–3 minutes). In this regard, liner layer 16 is formed of a material which only undergoes a slow polishing rate using the alumina abrasive and ferric nitride oxidizer polish contemplated herein. Hence, the still exposed portions of liner layer 16 must undergo a separate polishing step for removal thereof, i.e., so as to disconnect (separate) metal lines 46 from one another along such exposed portions of liner layer 16 at trench area 17, in conventional manner. Consequently, at this point, metal lines 46 are not only unconnected to each other through the (now removed) copper of copper metal layer 15, but also unconnected to each other through the (now removed) Ta/TaN of liner layer 15 outwardly of trenches 18, thereby preventing electrical shorting among metal lines 46.

Thereafter, wafer 10 may be subjected to deposition of an interlayer dielectric coating on the damascene pattern area and field area, prior to further processing of the wafer.

The successive two-step first phase CMP process of the invention advantageously permits the achievement of lower or reduced dishing, measured by dishing depth 47, and lower or reduced oxide erosion, measured by oxide erosion depth 48, than the prior art one-step first phase CMP process, as noted below.

Figure 4:
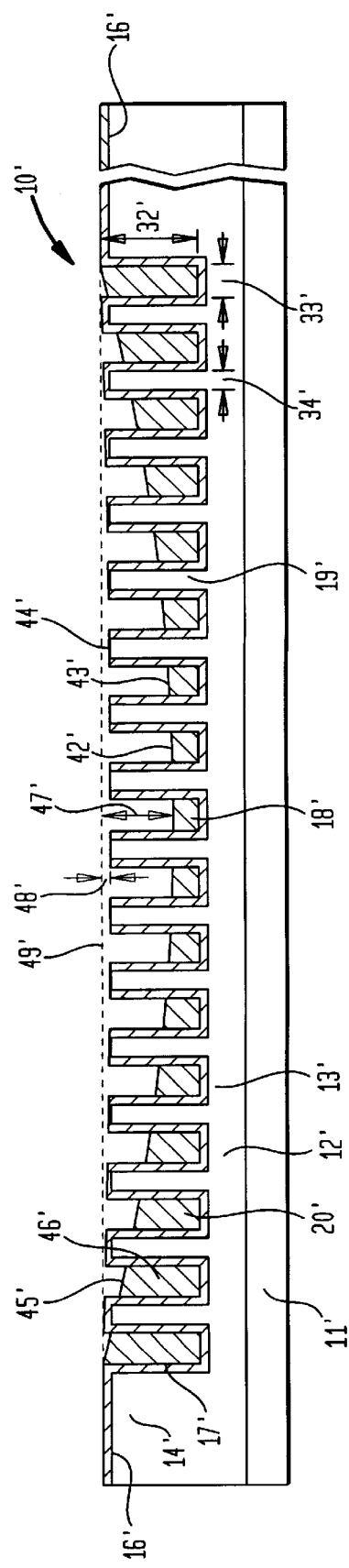
FIG. 4 is a side sectional view similar to FIG. 3, but of a semiconductor wafer subjected to the known CMP process according to the prior art, and illustrating the resultant pronounced dishing of the metal lines.

Referring now to FIG. 4, there is shown a side sectional view similar to FIG. 3, but of a semiconductor wafer of the type shown in FIG. 1 which has been subjected to the conventional one-step first phase CMP process according to the prior art. It illustrates the pronounced dishing of the metal lines that typically occurs using the prior art one-step CMP process. In FIG. 4, items designated by prime (') numbers 10' to 14', 16' to 20', 32' to 34' and 42' to 49' are the same as or correspond to those numbers without primes shown in FIG. 3.

The one-step prior art first phase CMP process is effected by a rotating polishing pad, e.g., at about 20–100 rpm, such as 55 rpm, using an alumina abrasive and ferric nitride as oxidizer at a comparatively high polishing pressure downforce of about 3–8 psi, such as about 4.5 psi, continuously for a total polishing time of about 210 seconds (3.5 minutes), as earlier noted.

FIG. 4 shows that the metal layer has been removed by the single first phase CMP step, to expose a polished surface 42' which defines a pronouncedly dished composite metal line surface 43' and attendant oxide interspace erosion surface 44', resulting in individual metal line surfaces 45' of individual metal lines 46' unconnected to each other, i.e., unconnected through the copper metal of the lower metal portion of the copper metal layer. Dishing depth 47' and oxide erosion depth 48' relative to reference plane 49' show that pronounced dishing and generally some oxide and/or liner layer erosion occur consequent the prior art single step first phase CMP process conditions, compared to the slight dishing and oxide erosion that occur per dishing depth 47 and oxide erosion depth 48 relative to reference plane 49 consequent the two-step first phase CMP process conditions of the invention (see FIG. 3).

In effect, compared to the one-step CMP process of the prior art, the two-step CMP process of the invention primarily provides:

(a) both a reduction in dishing depth (amount) and a reduction in polishing time (an increase in process rate), but also secondarily provides:

(b) a reduction in dishing depth (amount) at a selective constant (i.e., the same, minimized) polishing time (constant process rate), or (c) a reduction in polishing time (an increase in process rate) at a selective constant (i.e., the same, minimized) dishing depth (amount), as the case may be.

Specifically, the process of the present invention makes use of two basic facts:

(1) The relationship between polishing pressure downforce on the one hand, and both dishing and process speed (polishing rate) on the other hand, to wit, an increase in such downforce increases both the dishing and polishing rate (thus shortening the process time). The process speed is measured by the polishing time per wafer or the removal rate of the metal, e.g., copper, as noted in connection with Table 1 below.

(2) Dishing mainly occurs during the second, i.e., overpolishing, portion (step) of the first phase of the polishing process (cf. FIG. 3), i.e., when the rotating polishing pad makes contact with the liner layer in the field area and the metal lines are still exposed to the polishing process. During the first, i.e., bulk polishing, portion (step) of the first phase of the polishing process (cf. FIG. 2), dishing does not significantly occur as long as the metal, e.g., copper, is exposed generally everywhere on the wafer, as is noted in connection with FIG. 5 below.

Combining these two facts, the first phase CMP polishing process of the invention contemplates a first step which uses a comparatively high polishing pressure downforce for the bulk polishing of the metal layer. This affords a comparatively high process rate (shorter polishing time) while not significantly increasing, if at all, the attendant dishing. After the bulk metal has been removed from the field area leaving the liner layer exposed or covered with only a small portion of the bulk metal at this location, the process of the invention contemplates a second step which switches to a comparatively lower polishing pressure downforce. While this second step is conducted at a slower polishing rate, it results in only slight (minimized) dishing.

The one-step first phase CMP process of the prior art uses a lower polishing pressure downforce throughout in order to achieve the required dishing performance, i.e., to minimize the dishing depth as far as possible. By contrast, the two-step first phase CMP process of the invention involves differential polishing pressure downforces, for greater control of the metal layer removal, and leads:

(a) in a first case to a reduction in both dishing depth (amount) and total process time, (b) in a second case to a reduction in dishing depth (amount) at a selective constant, yet minimized, total process time, or (c) in a third case to a selective total process time reduction without adversely affecting the dishing performance, i.e., without otherwise increasing the dishing depth (amount) and thus while still minimizing the dishing depth, as the case may be.

Figure 5:
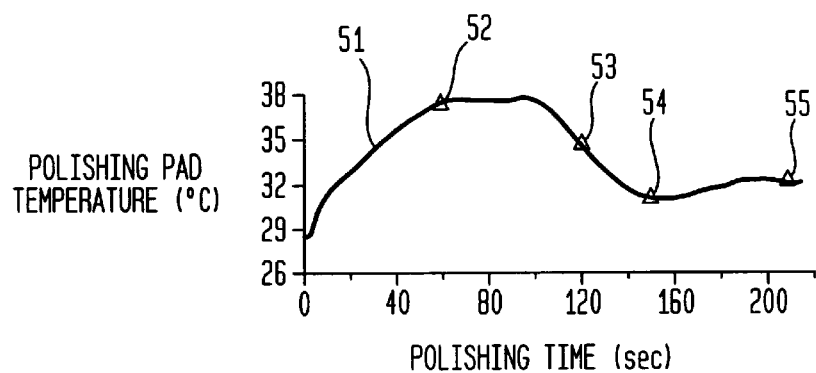
FIG. 5 is a graph having a curve of polishing time versus polishing pad temperature, for deriving the evolution of metal line dishing upon CMP of a semiconductor wafer of the type shown in FIG. 1.

Referring now to FIG. 5, there is shown a graph having a curve of polishing time in seconds (x-axis, abscissa) versus polishing pad temperature in ° C. (y-axis, ordinate), for deriving the evolution of metal line dishing upon CMP of a semiconductor wafer of the type shown in FIG. 1.

The graph of FIG. 5 illustrates a typical curve 51 for the main portion of a 210 second (3.5 minute) process time run of the known one-step first phase CMP process, e.g., effected at a polishing pad rotation of about 55 rpm and a polishing pressure downforce of about 4.5 psi. Curve 51 has a 60 second (1 minute) polishing time point 52, a 120 second (2 minute) polishing time point 53, a 150 second (2.5 minute) polishing time point 54, and a 210 second (3.5 minute) polishing time point 55. It is clear that curve 51 delineates two inherently different portions for the overall first phase CMP process.

The first, i.e., bulk, portion extends roughly over the first 120 second (2 minute) time period, including time points 52 and 53, as the polishing pad temperature rises from about 27° C. to about 37° C., and then starts to decline again. This first portion represents the condition where the metal layer is exposed throughout its extent on the wafer (FIG. 1), and ends with the start of the drop in the polishing pad temperature at time point 53 when the bulk of the metal layer has been removed (cf. FIG. 2).

The second, i.e., overpolishing, portion extends over the next 90 second (1.5 minute) time period as shown in FIG. 5, including time point 53 at 120 seconds (2 minutes), time point 54 at 150 seconds (2.5 minutes) and time point 55 at 210 seconds (3.5 minutes), as the polishing pad temperature drops to about 32° C. Thus, the first phase CMP process totals about 210 seconds (3.5 minutes), as earlier noted. The second portion represents the condition where the liner layer is exposed and overpolishing is effected to remove the remainder of the metal layer and which leads to most of the dishing (cf. FIG. 3 and FIG. 4).

Thus, the first phase CMP process totals about 210 seconds (3.5 minutes) for both the first, bulk, portion and the second, over polishing, portion. The second phase CMP process, i.e., for removing the liner layer, if present, continues for some time thereafter, i.e., an additional 90 seconds, not shown in FIG. 5, totalling 300 seconds (5 minutes) for both the first and second phases of the CMP process operation.

Figure 6:
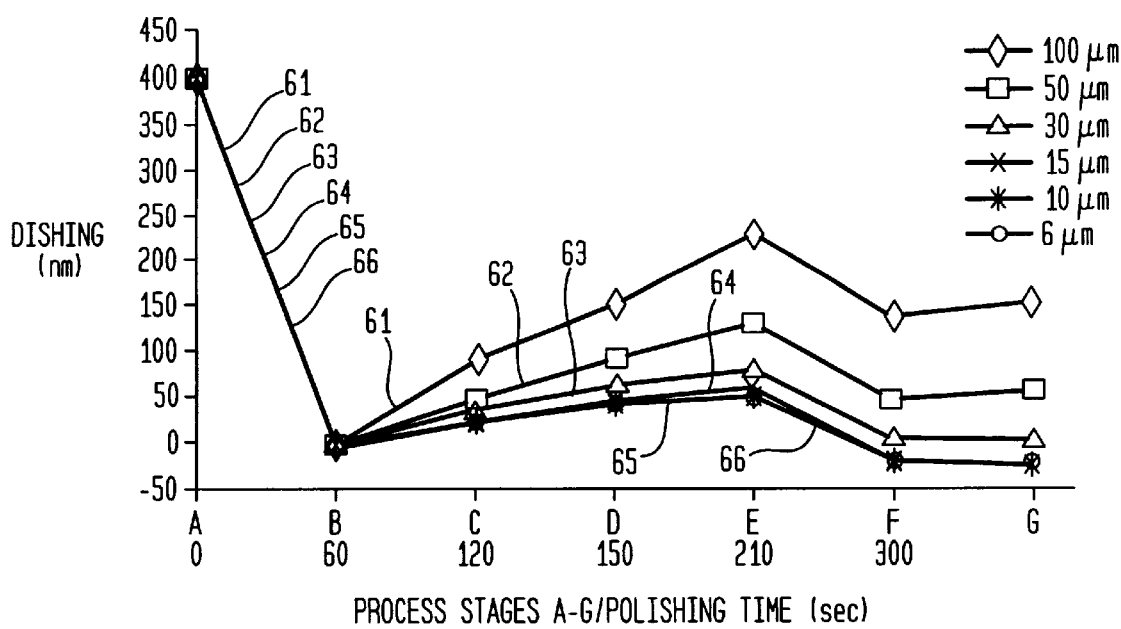
FIG. 6 is a graph having curves of process stages A–G/polishing time versus dishing depth for various wide metal line widths and showing in conjunction with FIG. 5 the CMP process stages at which metal line dishing occurs.

Referring now to FIG. 6, there is shown a graph having curves 61–66 of process stages A–G/polishing time in seconds (x-axis, abscissa) versus dishing depth in nm (y-axis, ordinate) for wide metal lines of various widths in microns and showing in conjunction with FIG. 5 the CMP process stages at which metal line dishing occurs.

Curves 61–66 represent the results of runs of the one-step prior art first phase CMP process, i.e., effected by a rotating polishing pad, e.g., at about 55 rpm, using an alumina abrasive and ferric nitride as oxidizer at a polishing pressure downforce of about 4.5 psi for a process time of about 210 seconds (3.5 minutes) followed by the second phase CMP process for removing the liner layer, if present, as earlier noted.

In the graph of FIG. 6, curves 61–66 show the dishing performance (depth) of metal lines of various widths at process stages A–G generally corresponding to given polishing times. Stage A is the symbolic starting point, i.e., at which the oxide layer inherently has a 400 nm dishing depth prior to deposition of the metal layer thereon, or at which the metal layer is in as plated condition thereon (cf. FIG. 1), stage B is the 60 second (1 minute) time point, stage C is the 120 second (2 minute) time point (cf. FIG. 2), stage D is the 150 second (2.5 minute) time point, stage E is the 210 second (3.5 minute) time point, i.e., the end of the first phase CMP process (cf. FIG. 3 and FIG. 4), stage F is the 300 second (5 minute) time point, symbolically representing the wafer condition after liner layer touch up polishing, i.e., the end of the second phase CMP process, and stage G is the wafer condition after subsequently depositing an interlayer dielectric coating thereon.

Curve 61 represents a 100 micron width metal line, curve 62 represents a 50 micron width metal line, curve 63 represents a 30 micron width metal line, curve 64 represents a 15 micron width metal line, curve 65 represents a 10 micron width metal line, and curve 66 represents a 6 micron width metal line.

For comparison, stage A shows in terms of the left-most slope portion of curves 61–66 that the trench depth is 400 nm.

As is clear from FIG. 5 taken in conjunction with FIG. 6, the second portion of the first phase CMP, which begins after the first 120 seconds (2 minutes) upon the drop in the polishing pad temperature as indicated by time point 53 in FIG. 5, and lasts for about 90 seconds (1.5 minutes) as noted in FIGS. 5 and 6, accounts for most of the dishing per curves 61–66 in FIG. 6, whereas the 120 second (2 minute) first portion of the first phase CMP makes only a small contribution, if any, to the dishing. FIG. 6 also makes clear that the dishing performance is consistent throughout stages A–G yet the dishing depth increases as the wide metal line width increases from a 6 micron width per curve 66 to a 100 micron width per curve 61.

The present invention therefore utilizes the drop in polishing pad temperature (cf. FIG. 5) as an indication of the transition of the metal layer condition from a thick layer, with a large overburden portion assuring adequate metallization of the oxide layer trench arrangement area (cf. FIG. 1) yet which must be removed to provide the metal lines in the trenches, to a thin layer of overlying metal still connecting the arrangement of lines to each other (cf. FIG. 2).

The thickness of metal layer 15, and especially of the lower portion 21 thereof, i.e., which is outwardly of (above) trenches 18, at this point, may be determined not only by a change in pad temperature, as aforesaid, but also by other conventional means such as polish time intervals, inductively coupled measurement and the like.

This permits the first CMP step of the invention to be confidently effected at a relatively high polishing pressure downforce and fast process rate (short process time) without fear of creating pronounced dishing (cf. FIG. 2). It also permits the second CMP step of the invention to be effected at a relatively low polishing pressure downforce and slower process rate, to minimize or reduce attendant dishing and also minimize or reduce the total process time (cf. FIG. 3).

Table 1 below shows aspects of the relationship between polishing process downforce and each of process speed (polishing rate) and dishing, in terms of gradients of change (increase) of process speed with increase of downforce (as measured by the polishing time per wafer or the removal rate of copper), and also of change (increase) in dishing with increase of downforce, based on runs at different psi downforces per the known one-step first phase CMP process for wafers of the type shown in FIG. 1 having a metal layer of copper.

TABLE 1

| Process Parameter | Gradient |
| --- | --- |
| Change of Process Speed With Downforce | 13% per psi |
| Change of Dishing With Downforce | 6% per psi |

Clearly, increasing the polishing pressure downforce increases the process speed (i.e., shortens the process time) and also increases the dishing. The known one-step first phase CMP process typically uses a 4.5 psi downforce to meet dishing requirements. As noted in Table 1, the polishing rate for copper increases 13% for an increase of the polishing pressure downforce by 1 psi. The dishing of a test structure of the type shown in FIG. 1 increases by 6% per psi.

Based on these parameters, it is clear that the first CMP step of the first phase CMP process of the invention can be effected at a polishing pressure downforce of 6 psi and a process (polishing) time of 95 seconds for a wafer of the type shown in FIG. 1 having a copper metal layer, so as to remove the bulk of the copper layer without significant attendant dishing.

In turn, the second CMP step of the first phase CMP process of the invention can be effected at a selectively lower polishing pressure downforce of 3 psi and a polishing time of 115 seconds, so as to remove under milder downforce conditions the remainder of the copper layer while providing the individual copper lines unconnected to each other, yet with attendant minimized or reduced dishing as assured by the milder downforce conditions.

Thus, the polishing time of 95 seconds for the first step and 115 seconds for the second step, totals 210 seconds (3.5 minutes) for the two-step first phase CMP process of the invention. This is the same 210 seconds (3.5 minutes) total polishing time, at a constant 4.5 psi polishing pressure downforce throughout, as used for the one-step first phase CMP process of the prior art. However, the difference is that the 4.5 psi polishing pressure downforce used throughout the one-step CMP process of the prior art leads to pronounced dishing, whereas the lower psi polishing pressure downforce used in the second CMP step of the invention, e.g., about 20% or more lower than the polishing pressure downforce used in the first CMP step, leads to minimized or reduced dishing.

Because the first phase CMP process is divided into two steps, other things being equal, the polishing pressure downforce and process time parameters per the invention can be alternatively selected:

(a) to reduce both the dishing depth (amount) and polishing time (e.g., first step at 7 psi for 80 seconds, second step at 3 psi for 105 seconds, total time 185 seconds, the reduction in dishing being in this case about 10% relative to the dishing per said known one-step CMP process; cf. FIGS. 3 and 4);

(b) to reduce the dishing depth (amount) at a selective retained constant polishing time (e.g., first step at 6 psi for 95 seconds, second step at 3 psi for 115 seconds, total time 210 seconds, the reduction in dishing being in this case also about 10% relative to the dishing per said known one step CMP process; cf. FIGS. 3 and 4); or (c) to reduce the polishing time at a selective retained constant dishing depth (e.g., first step at 7 psi for 80 seconds, second step at 4.5 psi for 90 seconds, total time 170 seconds, the reduction in dishing being in this case 0% relative to the dishing per said known one-step CMP process).

An efficient two-step chemical mechanical polishing process is thus provided according to the invention for low dishing of an arrangement of metal lines formed in an arrangement of trenches on an insulation layer of a semiconductor wafer during its fabrication. The two-step process permits achievement of improved process speed (significantly shorter polishing time) is without pronounced dishing. More important, it permits achievement of improved RS (specific resistance) values for the metal lines in that dishing thereof is minimized or reduced.

To this end, in accordance with a preferred embodiment of the present invention, the first, bulk polishing, step comprises chemically mechanically polishing a semiconductor wafer defining a lower insulation layer, e.g., having a thickness of about 100–2000 nm and containing a medial trench area having an arrangement of closely spaced apart trenches and a peripheral field area outwardly of the trench area, and an upper metal layer having a thickness of about 200–2000 nm and disposed on the insulation layer and extending across the field area and the trench area and forming a corresponding arrangement of closely spaced apart metal lines in the trenches, which lines are upwardly contiguous with an immediately overlying portion of the metal layer.

The first step is effected at a selectively high downforce, e.g., of about 5–8 psi, sufficient to remove at a corresponding high rate the portion of the metal layer extending across the field area and the trench area substantially without removing the portion of the metal layer immediately overlying the arrangement of metal lines in the trenches and substantially without dishing of the portion of the metal layer forming the arrangement of metal lines.

The second, overpolishing, step comprises continuing the CMP at a selectively lower downforce, e.g., of about 1–5 psi, sufficient to overpolish the field area and to remove at a corresponding lower rate the portion of the metal layer immediately overlying the arrangement of metal lines with attendant minimized or reduced dishing to an extent for providing the arrangement of metal lines as individual metal lines unconnected to each other (i.e., unconnected through the metal [copper] of the metal layer) and correspondingly disposed in the arrangement of trenches.

The first and second steps are suitably effected at a minimized or reduced total polishing time, of which, according to one particular feature of the invention, about 50–66.7% is used in the first step and about 50–33.3% is used in the second step, such as a total polishing time of about 120–480 seconds (2–8 minutes).

Accordingly, it can be appreciated that the specific embodiments described are merely illustrative of the general principles of the invention. Various modifications may be provided consistent with the principles set forth.

What is claimed is:

1. A chemical mechanical polishing process for low dishing of metal lines formed in trenches in an insulation layer of a semiconductor wafer during fabrication thereof, comprising:

a first step of chemically mechanically polishing a metal layer disposed on the insulation layer and having a lower portion located in the trenches of the insulation layer for forming metal lines and an upper portion overlying the lower portion;

the first step polishing being effected at a selectively high downforce sufficient to remove at a corresponding high rate the upper portion of the metal layer substantially without removing the lower portion thereof and substantially without dishing of the lower portion located in the trenches; and a second step of continuing the polishing at a selectively lower downforce sufficient to remove at a corresponding lower rate the lower portion of the metal layer with attendant minimized dishing to an extent for providing the metal lines as individual metal lines correspondingly disposed in the trenches.

2. The process of claim 1 wherein the first step is effected at a high downforce of about 3–8 psi, and the second step is effected at a lower downforce of about 1–5 psi, and wherein the total polishing time is about 120–480 seconds.

3. The process of claim 1 wherein the wafer comprises silicon, the insulation layer comprises silicon dioxide and the metal layer comprises copper.

4. The process of claim 1 wherein the insulation layer has a thickness of about 100–2000 nm and the metal layer has a thickness of about 200–2000 nm.

5. The process of claim 1 wherein the polishing is effected using a chemical mechanical polish comprising an alumina abrasive and ferric nitride as oxidizer.

6. The process of claim 1 wherein a liner layer forming an adhesion promoting diffusion barrier is disposed between the insulation layer and the metal layer.

7. The process of claim 6 wherein the wafer comprises silicon, the insulation layer comprises silicon dioxide, the metal layer comprises copper and the liner layer comprises tantalum/tantalum nitride.

8. The process of claim 6 wherein the insulation layer has a thickness of about 100–2000 nm, the metal layer has a thickness of about 200–2000 nm and the liner layer has a thickness of about 5–200 nm.

9. A chemical mechanical polishing process for low dishing of metal lines formed in trenches in an insulation layer of a semiconductor wafer during fabrication thereof, comprising:

a first, bulk polishing, step of chemically mechanically polishing a semiconductor wafer defining a lower insulation layer containing a medial trench area having closely spaced apart trenches and a peripheral field area outwardly of the trench area, and an upper metal layer disposed on the insulation layer and extending across the field area and the trench area and forming corresponding closely spaced apart metal lines in the trenches, which lines are upwardly contiguous with an immediately overlying portion of the metal layer;

the first step polishing being effected at a selectively high downforce sufficient to remove at a corresponding high rate the portion of the metal layer extending across the field area and the trench area substantially without removing the portion of the metal layer immediately overlying the metal lines in the trenches and substantially without dishing of the portion of the metal layer forming the metal lines; and a second, overpolishing, step of continuing the polishing at a selectively lower downforce sufficient to overpolish the field area and to remove at a corresponding lower rate the portion of the metal layer immediately overlying the metal lines with attendant minimized dishing to an extent for providing the metal lines as individual metal lines unconnected to each other through the metal of the metal layer and correspondingly disposed in the trenches.

10. The process of claim 9 wherein the first step is effected at a high downforce of about 3–8 psi, and the second step is effected at a lower downforce of about 1–5 psi, and wherein the total polishing time is about 120–480 seconds.

11. The process of claim 9 wherein the wafer comprises silicon, the insulation layer comprises silicon dioxide and the metal layer comprises copper.

12. The process of claim 9 wherein the insulation layer has a thickness of about 100–2000 nm and the metal layer has a thickness of about 200–2000 nm.

13. The process of claim 9 wherein the polishing is effected using a chemical mechanical polish comprising an alumina abrasive and ferric nitride as oxidizer.

14. The process of claim 9 wherein a liner layer forming an adhesion promoting diffusion barrier is disposed between the insulation layer and the metal layer.

15. The process of claim 14 wherein the wafer comprises silicon, the insulation layer comprises silicon dioxide, the metal layer comprises copper and the liner layer comprises tantalum/tantalum nitride.

16. The process of claim 14 wherein the insulation layer has a thickness of about 100–2000 nm, the metal layer has a thickness of about 200–2000 nm and the liner layer has a thickness of about 5–200 nm.

17. A chemical mechanical polishing process for low dishing of copper lines formed in trenches in a silicon dioxide insulation layer of a silicon semiconductor wafer during fabrication thereof, comprising:

a first, bulk polishing, step of chemically mechanically polishing a silicon semiconductor wafer defining a lower silicon dioxide insulation layer having a thickness of about 100–2000 nm and containing a medial trench area having closely spaced apart trenches and a peripheral field area outwardly of the trench area, an upper copper layer having a thickness of about 200–2000 nm and disposed on the insulation layer and extending across the field area and the trench area and forming corresponding closely spaced apart copper lines in the trenches, which lines are upwardly contiguous with an immediately overlying portion of the copper layer, and an intermediate liner layer forming an adhesion promoting diffusion barrier disposed between the insulation layer and the copper layer;

the first step polishing being effected at a selectively high downforce of about 3–8 psi sufficient to remove at a corresponding high rate the portion of the copper layer extending across the liner layer, the field area and the trench area substantially without removing the portion of the copper layer immediately overlying the copper lines in the trenches and substantially without dishing of the portion of the copper layer forming the copper lines; and a second, overpolishing, step of continuing the polishing at a selectively lower downforce of about 1–5 psi sufficient to overpolish the liner layer and the field area and to remove at a corresponding lower rate the portion of the copper layer immediately overlying the copper lines with attendant minimized dishing to an extent for providing the copper lines as individual copper lines unconnected to each other through the copper of the copper layer and correspondingly disposed in the trenches;

the first and second steps being effected at a minimized total polishing time of about 120–480 seconds.

18. The process of claim 17 wherein the liner layer comprises tantalum/tantalum nitride and has a thickness of about 5–200 nm.

19. The process of claim 17 wherein the polishing is effected using a chemical mechanical polish comprising an alumina abrasive and ferric nitride as oxidizer.

20. A chemical mechanical polishing process for low dishing of metal lines formed in trenches in an insulation layer of a semiconductor wafer during fabrication thereof, comprising:

a first step of chemically mechanically polishing a metal layer disposed on the insulation layer and having a lower portion located in the trenches of the insulation layer for forming metal lines and an upper portion overlying the lower portion;

the first step polishing being effected at a selectively high downforce sufficient to remove at a corresponding high rate the upper portion of the metal layer substantially without removing the lower portion thereof and substantially without dishing of the lower portion located in the trenches; and a second step of continuing the polishing at a selectively lower downforce which is at least about 20% less than the high downforce of the first step and sufficient to remove at a corresponding lower rate the lower portion of the metal layer with attendant minimized dishing to an extent for providing the metal lines as individual metal lines correspondingly disposed in the trenches;

the first and second steps being effected so as to reduce both the amount of dishing and total polishing time.

21. A chemical mechanical polishing process for low dishing of metal lines formed in trenches in an insulation layer of a semiconductor wafer during fabrication thereof, comprising:

a first step of chemically mechanically polishing a metal layer disposed on the insulation layer and having a lower portion located in the trenches of the insulation layer for forming metal lines and an upper portion overlying the lower portion;

the first step polishing being effected at a selectively high downforce sufficient to remove at a corresponding high rate the upper portion of the metal layer substantially without removing the lower portion thereof and substantially without dishing of the lower portion located in the trenches; and a second step of continuing the polishing at a selectively lower downforce which is at least about 20% less than the high downforce of the first step and sufficient to remove at a corresponding lower rate the lower portion of the metal layer with attendant minimized dishing to an extent for providing the metal lines as individual metal lines correspondingly disposed in trenches;

the first and second steps being effected so as to reduce the amount of dishing at a selective total polishing time.

22. A chemical mechanical polishing process for low dishing of metal lines formed in trenches in an insulation layer of a semiconductor wafer during fabrication thereof, comprising:

a first step of chemically mechanically polishing a metal layer disposed on the insulation layer and having a lower portion located in the trenches of the insulation layer for forming metal lines and an upper portion overlying the lower portion;

the first step polishing being effected at a selectively high downforce sufficient to remove at a corresponding high rate the upper portion of the metal layer substantially without removing the lower portion thereof and substantially without dishing of the lower portion located in the trenches; and a second step of continuing the polishing at a selectively lower downforce which is at least about 20% less than the high downforce of the first step and sufficient to remove at a corresponding lower rate the lower portion of the metal layer with attendant minimized dishing to an extent for providing metal lines as individual metal lines correspondingly disposed in the trenches;

the first and second steps being effected so as to reduce the total polishing time at a selective amount of dishing.

* * * * *